US008296717B1

(12) United States Patent
O'Riordan

(10) Patent No.: US 8,296,717 B1
(45) Date of Patent: Oct. 23, 2012

(54) METHOD AND SYSTEM FOR IMPLEMENTING INHERITED CONNECTIONS FOR ELECTRONICS DESIGNS

(75) Inventor: Donald J. O'Riordan, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/973,846

(22) Filed: Dec. 20, 2010

(51) Int. Cl.
*G06F 17/50* (2006.01)
*G06F 15/04* (2006.01)

(52) U.S. Cl. .......................... 716/139; 716/126

(58) Field of Classification Search .................. 716/126, 716/139
See application file for complete search history.

(56) References Cited

U.S. PATENT DOCUMENTS

| 6,173,245 B1 * | 1/2001 | Karchmer et al. | 703/22 |
| 2005/0080502 A1 * | 4/2005 | Chernyak et al. | 700/97 |

OTHER PUBLICATIONS

Malik et al; "Virtuoso Multiple Supply Multiple Voltage (MSMV) Support"; Sep. 14, 2005; CDNLive; pp. 1-13.*

Cadence, "Inherited Connections Flow Guide: Product Version 5.0", Nov. 2004.
A. Basu, et al., "DOORS: An object-oriented CAD system for high level synthesis," IEE Proc.-Comput. Digit Tech. vol. 144, No. 5, Sep. 1997.
S. Areibi, et al., "A Genetic Algorithm Hardware Accelerator for VLSI Circuit Partitioning," Jan. 2005.
G. Economakos, et al., "Exploiting the Use of VHDL Specifications in the AGENDA High-Level Synthesis Environment," 1998.
J. Spoto, "A Revolutionary Solution for Unified RF System and Circuit Design," Apr. 2002.
O. Zinke, "Bi-Directional Mixed Signal Connection Modules for Automatic Insertion," 2002.
T. Brandtner, "Chip-package codesign flow for mixed-signal SiP designs," 2006.
N. Malik, "Virtuoso Multiple Supply Multiple Voltage," CDNLive, Sep. 2005.
D. C. Schmidt, "A Family of Design Patterns for Application-Level Gateways," Theory and Practice of Object Systems, Dec. 1996.

* cited by examiner

*Primary Examiner* — Suresh Memula
(74) *Attorney, Agent, or Firm* — Vista IP Law Group, LLP

(57) ABSTRACT

Disclosed are improved methods, systems, and computer program products for implementing inherited connections for electronic designs. Scoped default connection or global nets are used in inherited connections for default expressions, where the default connection/global net that is applied to a particular portion of the design is scoped by being limited in its application only to certain hierarchical portions of the design.

30 Claims, 14 Drawing Sheets

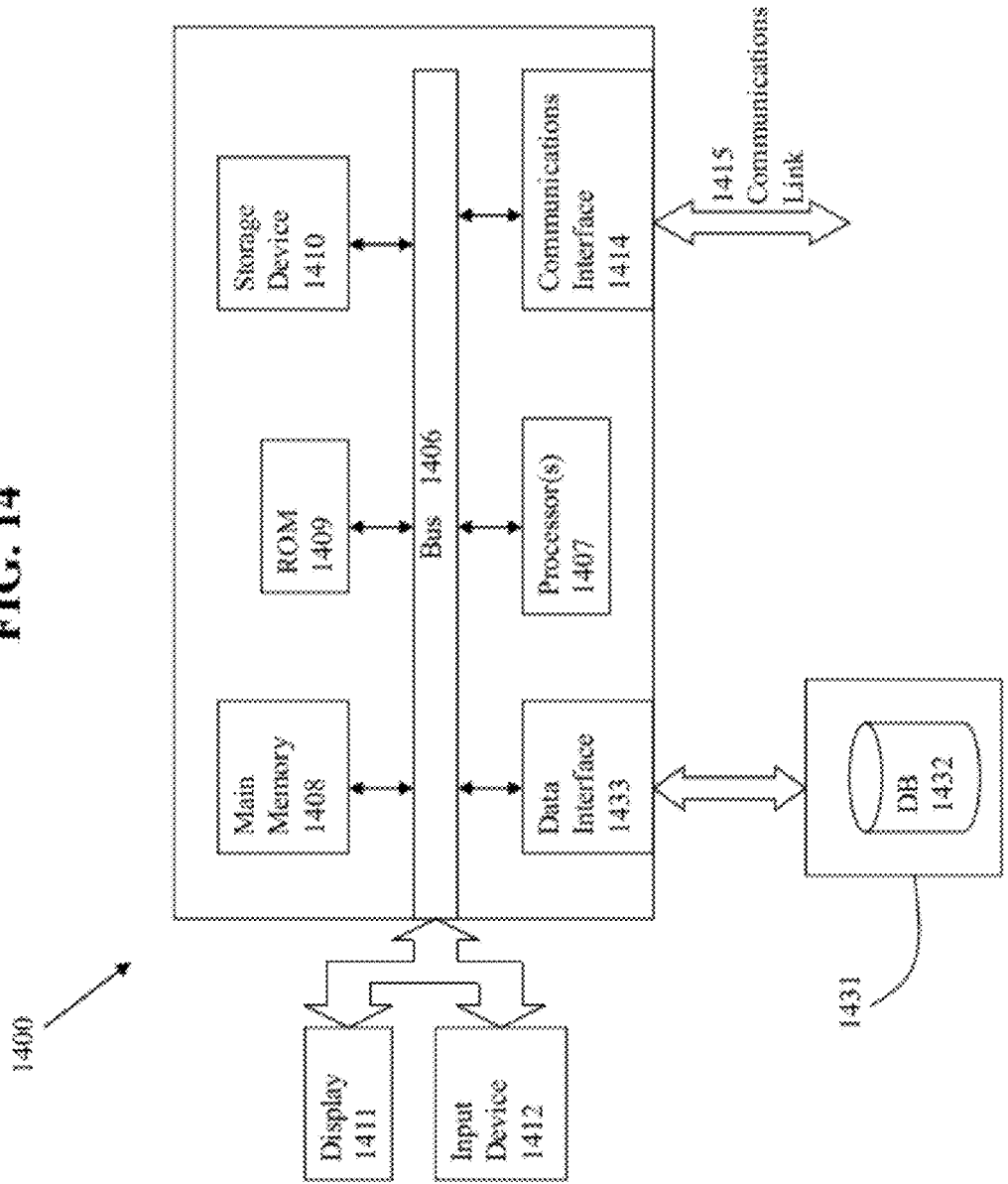

METHOD AND SYSTEM FOR IMPLEMENTING INHERITED CONNECTIONS FOR ELECTRONICS DESIGNS

BACKGROUND

The invention is directed to an improved approach for implementing inherited connections for electronic designs.

Modern electronic design activities are typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavior descriptions of the IC device and translates this high-level design language into netlists of various levels of abstraction. Essentially, the process to implement an electronic device begins with functional design and verification (e.g., using RTL), and then proceeds to physical design and verification.

Many modern electronic designs, such as a typical semiconductor integrated circuit (IC) design, are complex designs that include a large number of electronic components such as transistors, logic gates, and diodes. These complex designs are often implemented hierarchically with circuit schematics that are also hierarchical in nature.

Each portion (e.g., block or cell) of the hierarchical design may correspond to multiple levels of ancestor or descendent portions that may relate to inherited relationships for certain design or electronic properties. For example, consider the connections that need to be established between nets and/or pins in an electronic design. These connections may be explicitly specified by a designer. However, for many complex designs having a significantly large number of pins and nets, it is often impractical for a designer to individually specify a connection for each and every pin and net. Therefore, EDA tools can be implemented to automatically provide these connections using the concept of "inherited connections," in which a connection is established for an electronic component based upon the connection properties that are inherited from a related portion of the design somewhere in the design hierarchy. For example, inherited connections may be specified via a rule-based scheme, such that the hierarchy of a design is searched using the rule to identify whether or not an ancestor component specifies a connection that should be inherited by the child component. If the rule-based search successfully identifies a specified connection that can be inherited, then the inherited connections approach can be successfully used to implement the connections.

A possible problem with this approach arises when the rules-based search fails to identify an appropriate connection that can be inherited for the component. In this situation, it is possible that a "default" connection or default global net (such as $V_{DD}$ for power connections) is utilized as the connection upon such a failure to identify an inherited connection. This may not be a significant problem if the entire design is implemented by a single designer or by a small group of integrated designers, since they would all collectively have the same understanding as far as which connection should be utilized by default in this situation.

However, many (if not most) modern complex designs are not (and often cannot) be wholly implemented using a single designer or a small group of integrated designers. Instead, modern electronic designs are often implemented using components that are acquired from external IP (intellectual property) sources, whether within the same company or from third party vendors. In this situation, assigning a default global net connection upon failure to find a suitable inherited connection could present a serious problem. This is because two items of IP that did not explicitly specific a connection or an inherited connection may both end up connecting to the same global net by default, and the default connection to the default global net may therefore inadvertently create a short circuit between the two components that could cause operational problems for the circuit design.

Therefore, there is a need for an improved approach for implementing inherited connections for electronic designs that avoids the problems with prior approaches.

SUMMARY

Embodiments of the present invention provide an improved method, system, and computer program product for implementing inherited connections for electronic designs. According to some embodiments of the invention, "scoped" default connection or global nets are used in inherited connections for default expressions, where the default connection/global net that is applied to a particular portion of the design is scoped by being limited in its application only to certain hierarchical portions of the design. For example, in some embodiments, default global nets are scoped by being matched to specific L.C:V (library, cell, and view) values, where the scoped global net is applied by default only if the L.C:V for the default global net matches the L.C:V of the design portion being analyzed. In this manner, default connections/global nets are no longer universally applicable to all portions of the electronic design, and will thus result in eliminating or significantly reducing the occurrence of unintentional connections between unrelated portions of the design for inherited connections.

Other additional objects, features, and advantages of the invention are described in the detailed description, figures, and claims.

BRIEF DESCRIPTION OF FIGURES

FIG. 14 shows an architecture of an example computing system with which the invention may be implemented.

DETAILED DESCRIPTION

Embodiments of the present invention provide an improved method, system, and computer program product for implementing inherited connections for electronic circuit designs. According to some embodiments of the invention, "scoped" default connections or global nets are used in inherited connections for default expressions, where the default connection/global net that is applied to a particular portion of the design is scoped by being limited in its application only to certain hierarchical portions of the design. For example, in some embodiments, default global nets are scoped by being matched to specific triplet of values for L.C:V (library, cell, and view), where the scoped global net is applied by default only if the L.C:V for the default global net matches the L.C:V of the design portion being analyzed. In this manner, default connections/global nets are no longer universally applicable to all portions of the electronic design, and will thus result in eliminating or significantly reducing the occurrence of unintentional connections between unrelated portions of the design for inherited connections.

Figure 1:
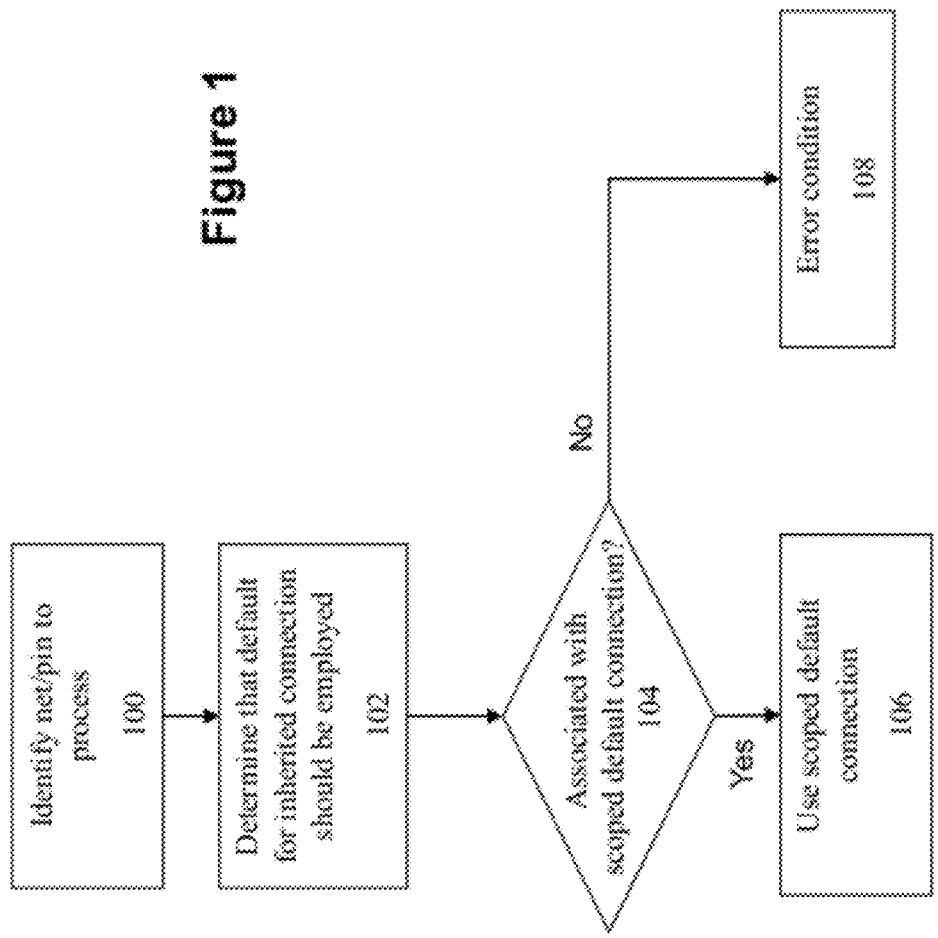
FIG. 1 depicts a flowchart of an approach for implementing inherited connections according to some embodiments of the invention.

FIG. 1 shows a high level flowchart of an approach for implementing some embodiments of the invention. At 100, identification is made of the component or object that needs to be processed for a connection. For example, the component may be a pin or a net within the electronic design that requires connectivity to be established.

At 102, a determination is made that default connection resolution should be applied to the component being processed. According to some embodiments, the default connection resolution is applied if the component does not have an explicitly configured connection, the component is configured for inherited connections, and no suitable inherited connection can be found for the either for the component itself or for an ancestor of that component in the design hierarchy.

A determination is made at 104 whether an association exists for a scoped default inherited connection to the component, where the default connection is applied only if the scope condition is met. In some embodiments, default inherited connections are scoped by being matched to specific L.C:V (library, cell, and view) values. The scoped default connection is applied only if the L.C:V associated with the default connection matches the L.C:V for component of interest.

Therefore, the scoped default is used to resolve the connection at 106 only if the scope condition matches component of interest. Otherwise, at 108, an error condition is issued without resolving the inherited connection to a global default.

Figure 2:
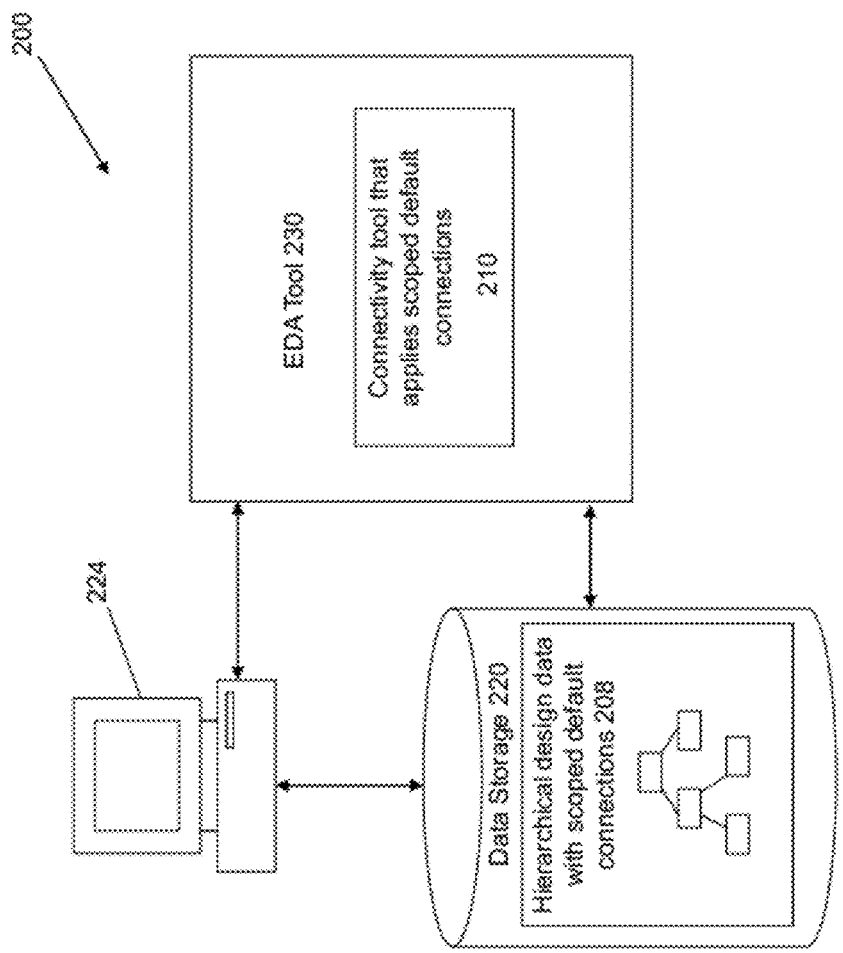
FIG. 2 illustrates an architecture of a system implementing inherited connections according to some embodiments of the invention.

FIG. 2 shows an architecture of a system 200 for implementing scoped default connections according to some embodiments of the invention. System 200 may include one or more users at one or more user stations 224 that operate the system 200 to design, edit, and/or plan electronic designs. The users at user station 224 correspond to any individual, organization, or other entity that uses system 200 for planning or designing an electronic design. Such users include, for example, chip architects, product designers, design engineers, and/or verification engineers. User station 224 comprises any type of computing station that may be used to operate, interface with, or implement EDA tools, applications or devices 230. Examples of such user stations 224 include for example, workstations, personal computers, or remote computing terminals. User station 224 comprises a display device, such as a display monitor, for displaying electronic designs and processing results to users at the user station 224. User station 224 also comprises one or more input devices for the user to provide operational control over the activities of system 200, such as a mouse or keyboard to manipulate a pointing object in a graphical user interface.

The user station 224 may be associated with one or more computer readable mediums or storage devices 220 that hold data regarding the user's electronic design 208. Computer readable storage device 220 comprises any combination of hardware and software that allows for ready access to the data that is located at the computer readable storage device 220. For example, computer readable storage device 220 could be implemented as computer memory operatively managed by an operating system. The computer readable storage device 220 could also be implemented as an electronic database system having storage on persistent and/or non-persistent storage.

Electronic design 208 comprises any suitable set of information or parameters that has developed relating to the design of an electronic circuit. According to some embodiments, the electronic design 208 relates to hierarchical design data that includes connections between components that have been resolved by default using inherited connections. The connections within the electronic design 208 are resolved using a connectivity tool 210 that applies scoping conditions to determine whether a given default connection resolution should be applied to a component within the electronic design 208. In some embodiments, the scoped connectivity tool utilizes the approach described herein, e.g., in the flowchart of FIG. 1.

This document will now describe illustrative examples of certain embodiments of the invention. For example, the following illustrative examples describe default inherited connections for the invention in the context of power connectivity and global nets such as $V_{DD}$. It is noted, however, that the examples presented herein are illustrative in nature only, and that the invention has broader application than just the illustrative examples presented below. As such, the invention is not to be limited in its application to only the described examples, and indeed, one skilled in the art would recognize that the invention may be applied to numerous other electronic design contexts.

FIGS. 3(a)-(d) show a very simple example schematic hierarchy. Circuit schematics are typically hierarchical, such as the full adder circuit shown in FIG. 3(c). The full-adder circuit of FIG. 3(c) can itself be decomposed into a number of sub-schematics, specifically two half-adder cells (cell: HADD shown in FIG. 3(b)), and an or-gate (cell OR), connected up as shown. Cell HADD OF FIG. 3(b) can also be de-composed into a half adder circuit shown in FIG. 3(a), which comprises a hierarchy of two AND gates, an OR gate, and in INV (not) as shown in FIG. 3(d). Most modern circuits are far more complicated, with many levels of hierarchy, and many instances and components. It can be seen in FIG. 3(a) that the half adder has two AND cell instances, one OR cell instance, and one INV cell instance (none of which are further decomposable, and which are known as leaf-level instances). The half adder cell also has four pins: A,B (inputs) and C, D (outputs). As stated above, FIG. 3(c) shows that the full adder contains two instances of the HADD cell, in addition to pins A, B, CI (inputs) and CO, S (outputs) and various (unnamed) connecting wires. A multiplier circuit for example may consistent of a matrix of hundreds of such full adders. A CPU circuit may consist of a number of multiplier circuits, in addition to other complex circuitry which can be themselves hierarchically composed.

It is also commonplace for a designer creating a large and complex circuit (such as a microprocessor) to obtain some components from external IP sources, and other components from internal IP sources, in addition to perhaps developing some components of his own. All such components may again be hierarchically composed.

Any given schematic block (or cell) can contain additional sub-instances (e.g., of other cells), which may be any combination of leaf-level cells, non-leaf level cells (which can be further decomposed), pins (typically used as connection points for the next level up in the hierarchy e.g. the illustrated half adder has pins A, B, C, D which are used as connection points as shown in the two half adder instances in FIG. 3(c).

Figure 4:
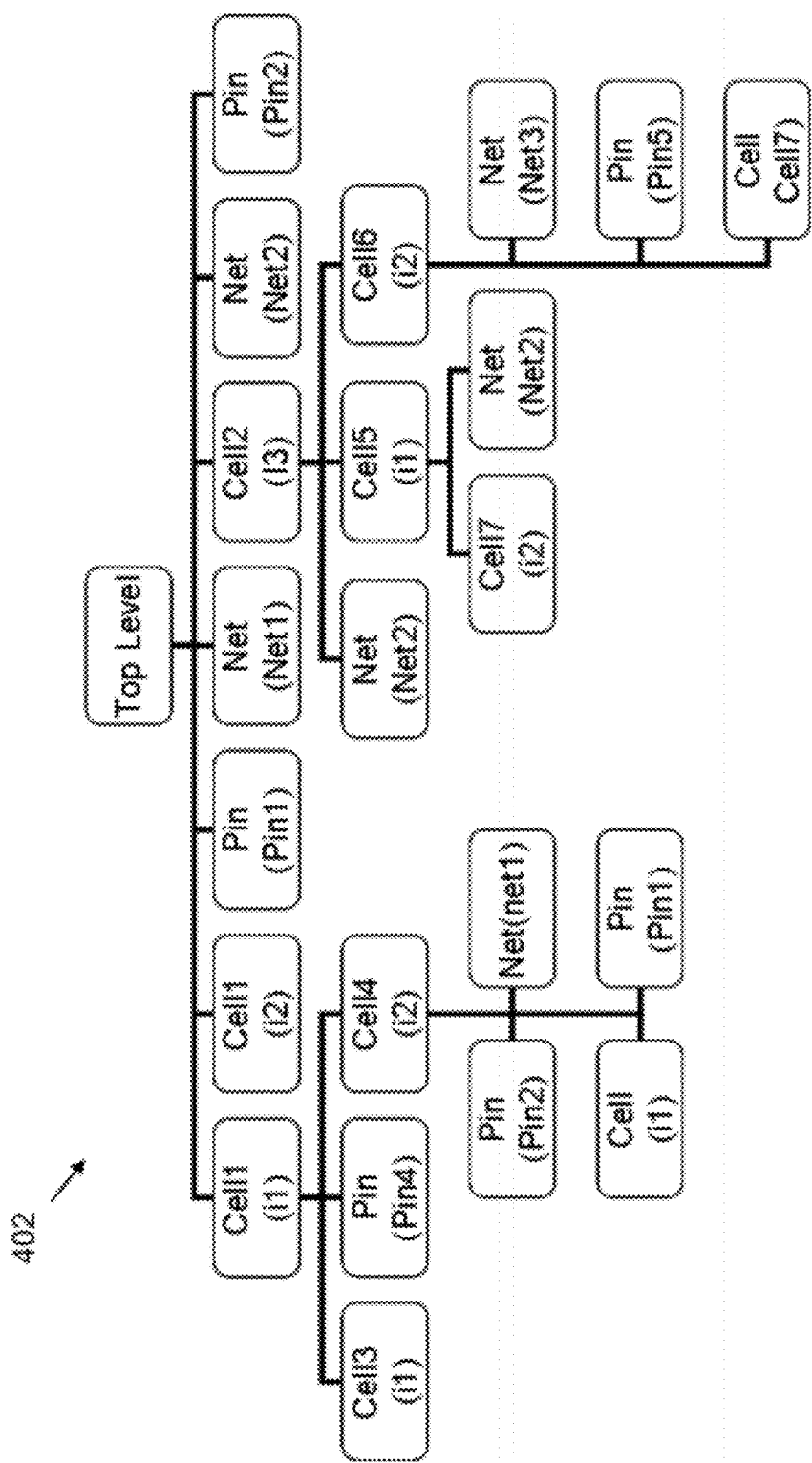
FIG. 4 shows an example hierarchical structure.

FIG. 4 shows this concept more generically. A schematic cell 402 has a somewhat recursive definition in that it can consist of instances of zero or more leaf-level cells, zero or more non-leaf level cells, zero or more nets, zero or more pins. Typically, all but leaf level schematic cell will contain multiple pins and nets and non-leaf instances of other cells.

Looking again at FIGS. 3(a)-(d), it can seen that the full adder circuit of FIG. 3(c) contains two half-adder (HADD) instances. The first one (upper left) is named 'ha1', and the second instance (lower, middle) is named 'ha2'. Pins A and B of the ha1 instance of cell HADD connect to full adder pins which co-incidentally happen to have the same names (A,B). Pin C of ha1 connects to the input of instance 'or1' (of cell OR). The connecting wire may or may not be explicitly named (it is not named in this example). If not explicitly named, an implicit name can be assigned to the wire. The pin D of instance 'ha1' of the first half-adder is connected to the input pin A of the second half-adder instance 'ha2'. The input pin B of the second half adder instance 'ha2' is connected to the CI pin of the full adder, while the output pin D of the same instance 'ha2' is connected to pin S of the full adder cell. Such connections can be explicitly drawn by schematically connecting wires from pins or instances to other pins or instances, or by drawing wire-stubs (i.e. non-continuous wires), where each end of the wire stub is explicitly named. Such conventions are common to those skilled in the state of the art.

Figure 5:
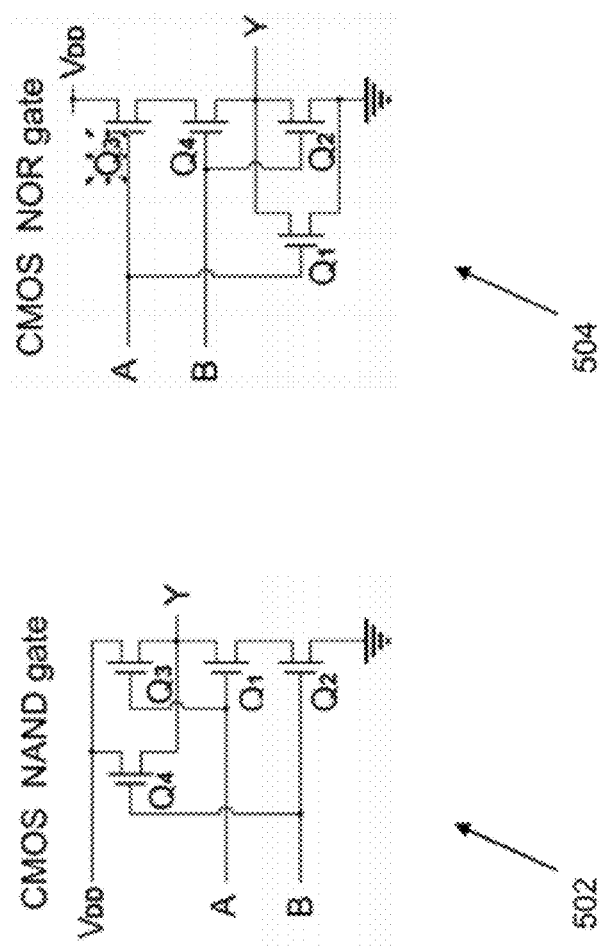
FIG. 5 illustrates example subschematics.

Further, the individual logic components such as NOR gates, NAND gates, OR gates etc are eventually realized via the manufacturing of connected transistor level devices. Example sub-schematics for some such gates 502 and 504 are shown in FIG. 5. Note that unlike the logic circuits described above, the transistor level implementation contain additional pins. In particular, these representations contain power pins such as the implicit ground pin and the named '$V_{DD}$' pin as shown. When it comes to physically implementing circuits such as the full adder of FIG. 3(c) or even more complex examples, it is normally necessary to also connect up these power pins which much exist for (practically) every leaf level cell. In some situations, e.g., for strictly logic-level circuits, the schematic may not need to show such power pins or wires connecting them as they are not necessary for the logical circuit description. However, other types of circuits, such as analog/mixed signal circuits or complete circuits designs in realizable form, may require such power pins to exist and to be routed.

The circuits may also include with power connectivity. There may be multiple instances of cells in the design, each of which has VDD and VSS power connections specified via explicit wire stub connections to instance terminals. The cells may also have terminal pins VDD and VSS, which are routed to the corresponding transistor level devices as needed. In general, there will be many instances in a design, each of which will hierarchically contain many more instances, each of which will need to have power pins which are electrically connected up before realization. Modern complex circuit designs may have very deep hierarchies of such components.

A commonly employed shortcut to dealing with this problem is to use global nets for power connection. Often a global net is used for VDD (considered electrically equivalent at any point in the circuit hierarchy) and its VSS counterpart.

A very large hierarchical design will often contain instances of different types of sub-design, and each such sub-design may have very different power requirements than the others. Examples may include high-voltage circuits operating off 3 volt supplies, low speed logic circuitry operating off 1.0 volt supplies, high-speed logic circuitry operating off 1.2 volt supplies, etc. This has led to the introduction of the concept of power domains, e.g., as illustrated in 602 of FIG. 6, in which different color codes can be used to indicate the different power domains.

Manually drawing/connecting such power connectivity schemes in hugely complex designs, particularly in modern integrated circuits which may consist of thousands or even millions of transistor devices, and is quite clearly an arduous and error-prone task. Hence, in order to deal with multiple power domains and 'voltage islands' in integrated circuit designs, while at the same time minimizing the amount of manual wiring (connecting wires or named wire stubs from pin to pin in hugely complex designs), the concept of inherited connections came about.

One approach to implementing inherited connections allows for power connectivity to be specified via a rule-based scheme, as opposed to requiring an explicit connection model. Any net or pin object could be declared as eligible for connection via this rule-based scheme, by assigning it a property to indicate this eligibility (which may be referred to as a 'net expression' property). The net expression itself had two parts, one part known as a property name, and the second being a default connection point (typically a global net). The core idea is that net/pin objects near the leaf-levels (or intermediate levels) of a vast design hierarchy could have their power connectivity programmed via a search/rule look up scheme.

Consider, however, the needs of the typical IP integrator. Large systems-on-chip designs typically comprise many IP blocks, not all of which are authored by the same source. Indeed, it is commonplace to integrate design IP sources which have been obtained from different vendors or design sites in addition to the company doing the top level design itself. Each piece of IP may employ the inherited connection scheme to declare its power intent, however there is no guarantee of consistency in the property naming. One piece of IP may define a property called 'PWR" to denote its power pin connectivity, while another may define a property called 'POWER' for the same meaning, with yet a third piece of IP using 'VDD'.

In order to deal with these situations, inherited connections may be used with the concept of 're-parameterization' such that at any level of the design, the inherited connection property names used by the lower levels of the design hierarchy could be re-parameterized to a new name. For example, a designer integrating the three pieces of IP considered above may decide to standardize on "AVDD" for the power property name used for his portions of the design (which contain the IP sources among other blocks). This scheme allows for unification of power connectivity property lookups as IP sources are integrated and combined.

One approach to implementing inherited connections is to have a default mode which is applied if the search for an inherited connection fails to identify a suitable connection. For example, VDD may be designated as the default connection upon the failure to identify an inherited connection for a pin or net.

When designs are large and complex with many levels of hierarchy, and when multiple IP sources and IP cells or subdesigns are involved and/or when multiple power domains are involved, this connectivity-via-rules process can get very difficult to manage. Mistakes and omissions (e.g., misapplication of defaults connections that lead to power domain short circuits) can be extremely costly leading to failed circuits.

Figure 7:
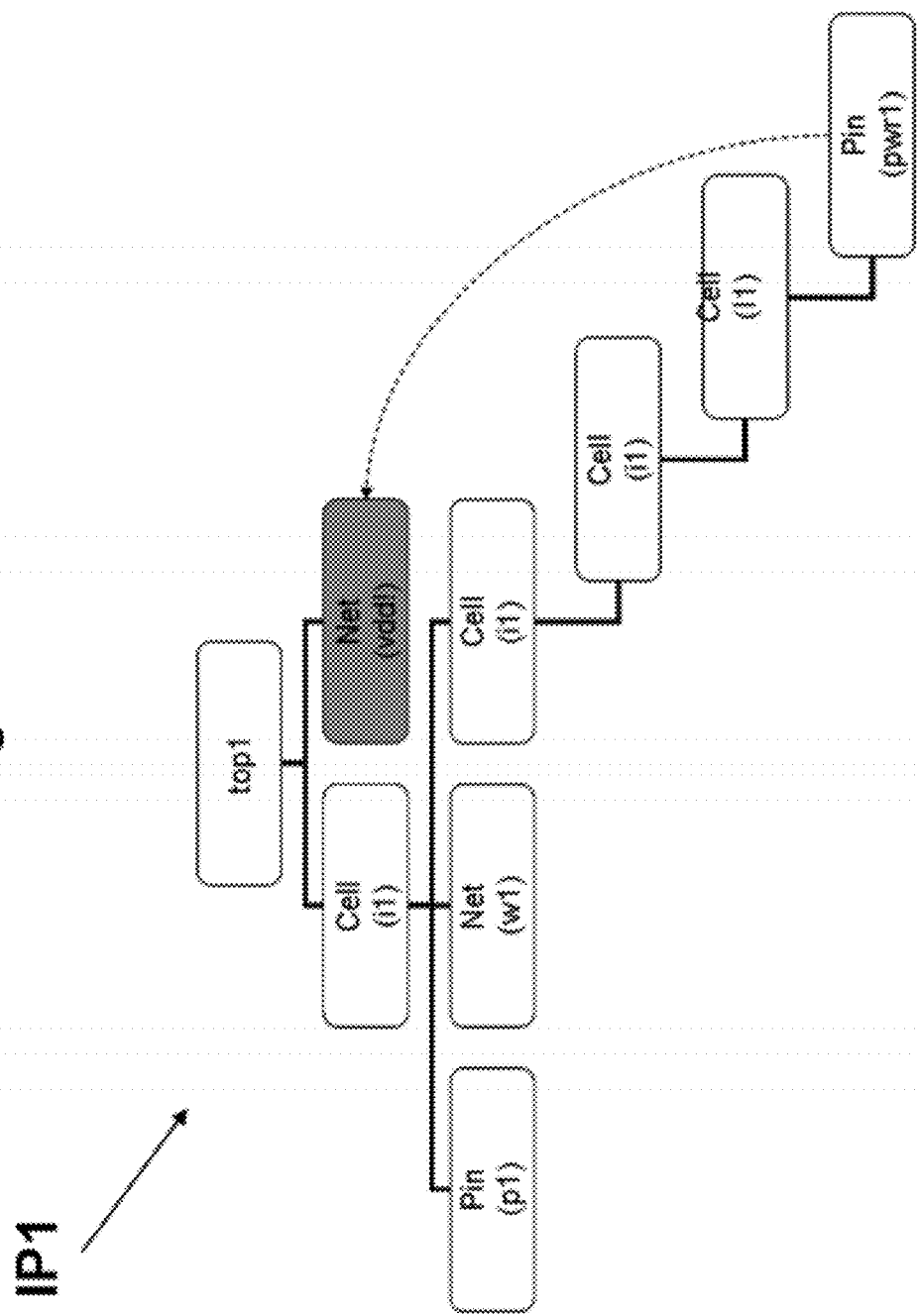
FIGS. 7-9 illustrate situations involving inheritance of connections.

The short circuit issue occurs because of possible assumptions that can be made in the default mechanism. In particular, it is possible that failure to find an appropriate inherited connection could result in resolution of the connection to a global default. To illustrate this problem, consider two IP sources, IP1 and IP2, which are authored independently, but in which both authors assume some default global net called "vdd!" is available for use as the 'default' when creating their inherited connection net expressions. Author 1 creates hierarchical IP block IP1 shown in FIG. 7. Within this hierarchical IP source, there is a low level pin called "pwr1", for which an inherited connection property is specified, with a default value of "vdd!". The global net "vdd!" is found within the top level cell top1 of IP source IP1, and the dotted line shows how the pin "pwr1" is connected to global net "vdd!" in the absence of any explicitly created 'net Sets'. The 'netSet' property, if specified, is explicitly placed on an instance and serves to resolve the connectivity by specifying a property name/signal name pair, where the signal exists locally within the instance upon which the netlist is placed.

Figure 8:
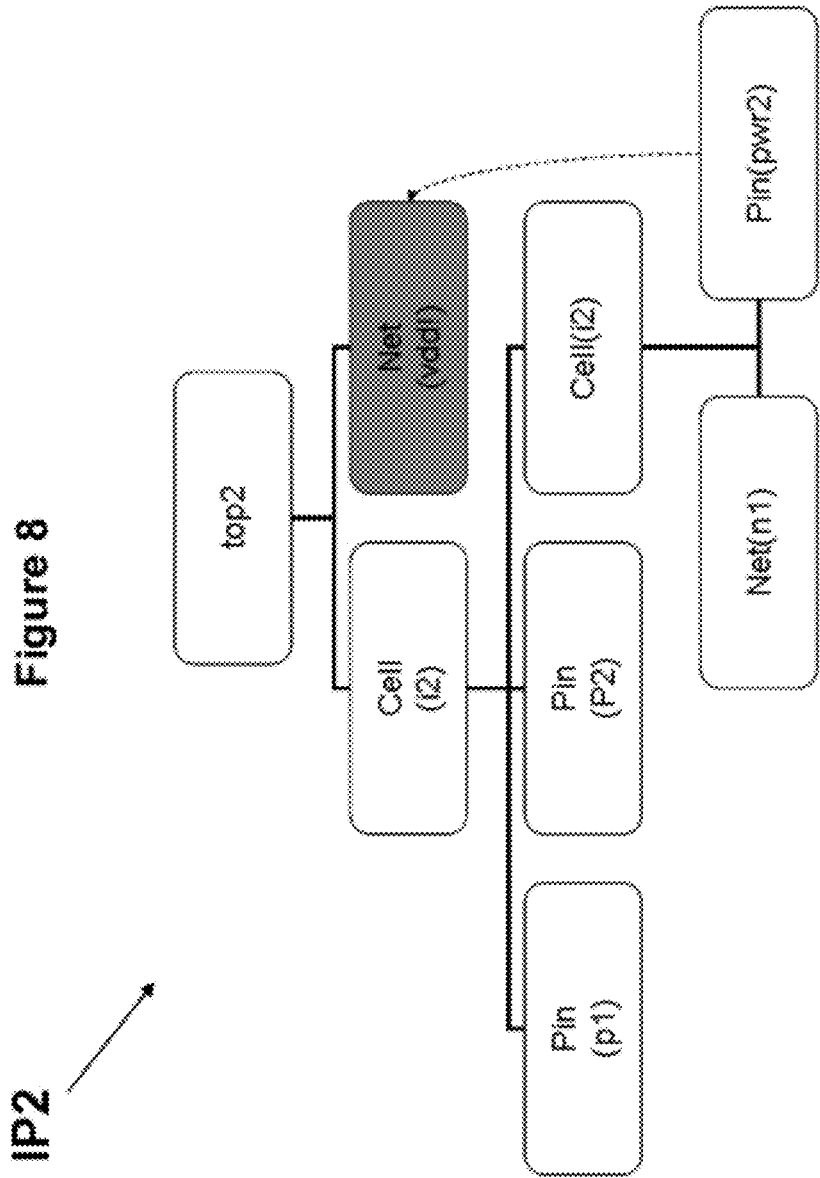

Now consider in FIG. 8 a similar IP source IP2 for which the top level cell is top2, below which a pin "pwr2" also has an inherited connection with a default using "vdd!". Again, in the absence of any explicit inherited connections ('netSets'), the default mechanism will connect pin "pwr2" to global net "vdd!"

Figure 9:
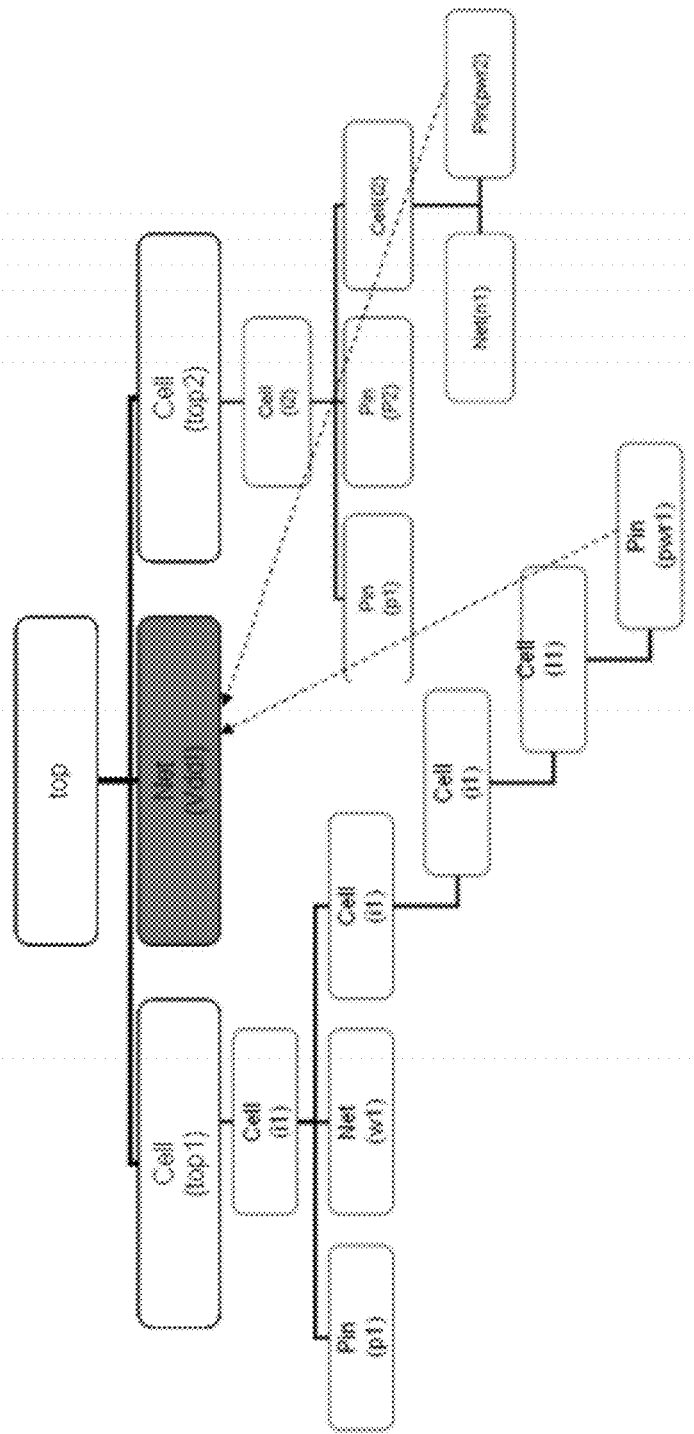

Now consider a case where both these IP sources are integrated into a higher level design block "top" as shown in FIG. 9. While the general intent of both IP authors was that the IP integrator would create explicit inherited connections on the top1 and top 2 cell instances respectively when doing the integration (e.g. connecting the first IP source to a 1.2V supply and the second IP source to a 1.0V supply), that isn't always the case in practice, and the default mechanism kicks in.

At this point, keeping with the current example, the global net "vdd!" can be considered to also exist within the new top cell "top" (as it is a global net after all), and in the absence of any explicit settings, the default mechanism may resolve both pin "pwr1" and pin "pwr2" to connect to the same global net "vdd!". The core issue here is that the inherited connection default mechanism makes an assumption regarding the existence of a global net (such as "vdd!") in the environment in which the IP is to be integrated. In situations such as this, such assumptions should clearly not be made.

Figure 10:
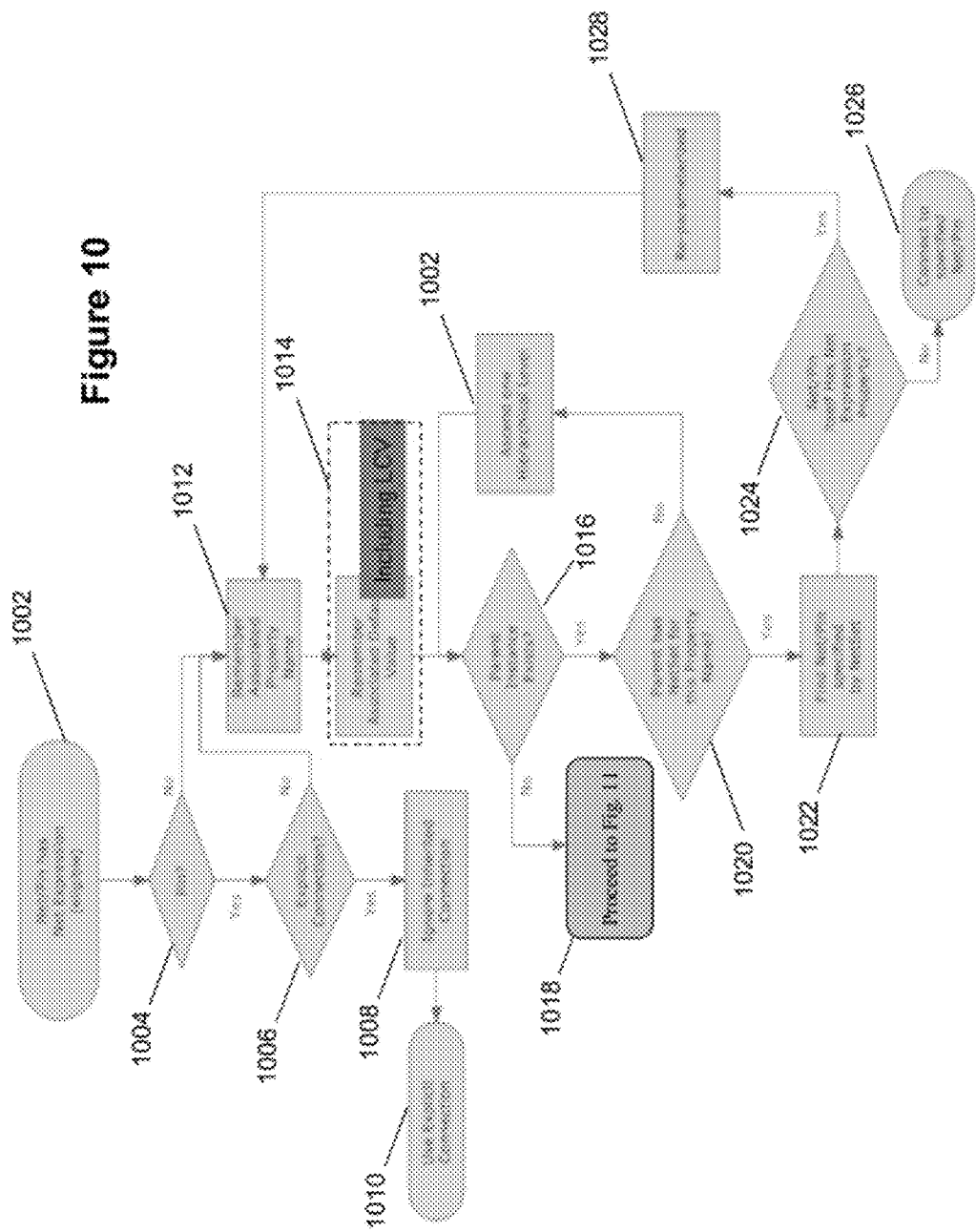
FIG. 10 depicts a detailed flowchart of an approach for implementing inherited connections according to some embodiments of the invention.

Some embodiments resolve this problem by introducing the concept of scoped global nets to be used in inherited connection default expressions. FIG. 10 shows a flowchart of an improved approach for implementing inherited connection resolution. There are several different objects/role players in the explanation. First, pins may be declared eligible for connection via the inherited connection scheme by assigning them a 'net expression' property. In addition, nets may also be declared eligible for connection in the same way. Net expression properties contain two portions: (i) a property name used in the search, and (ii) a 'default' used if the search fails to identify a suitable connection. Searching begins at the bottom of the hierarchy and works its way up, looking for a special property (referred to herein as a 'netSet') on any instance in the ancestry or design hierarchy in which the candidate net/pin exists. The netSet property attempts to resolve the connectivity by specifying a property name/signal name pair, such that any object lower in the hierarchy for which a search for that property has begun will be connected to the specified signal (usually a net or pin itself), thus 'setting' the connectivity. 'Net Set' properties are placed on cell instances, and contain a property name to signal name mapping.

The general approach is followed for each individual net/pin occurrence, where that net/pin object has a corresponding Net Expression property making it eligible for inherited connections (1002).

If the object that has a net expression is a pin object (1004), the approach first checks to see if the pin is explicitly connected (1006). If so, then an explicit connection (via drawn wire or named wire stub) will 'override' the inherited connection properties (1008), in which the inherited connection will be ignored and the explicit connection honored (1010). However, if the pin was not explicitly connected, then the approach will remember both the property name (1012) and the default value (1014) specified in the net expression.

In particular, the default value that is remembered at (1014) is associated with a scoping value that designates the scope of application for the default value. In some embodiments, the scoping value comprises a triplet L.C:V value corresponding to library, cell, and view values.

Likewise, for any Net (e.g., wire) object with a net expression property, the above will also occur, and the net expression property name and default value will be remembered, in which the default value is associated with a scoping value or filter.

Figure 11:
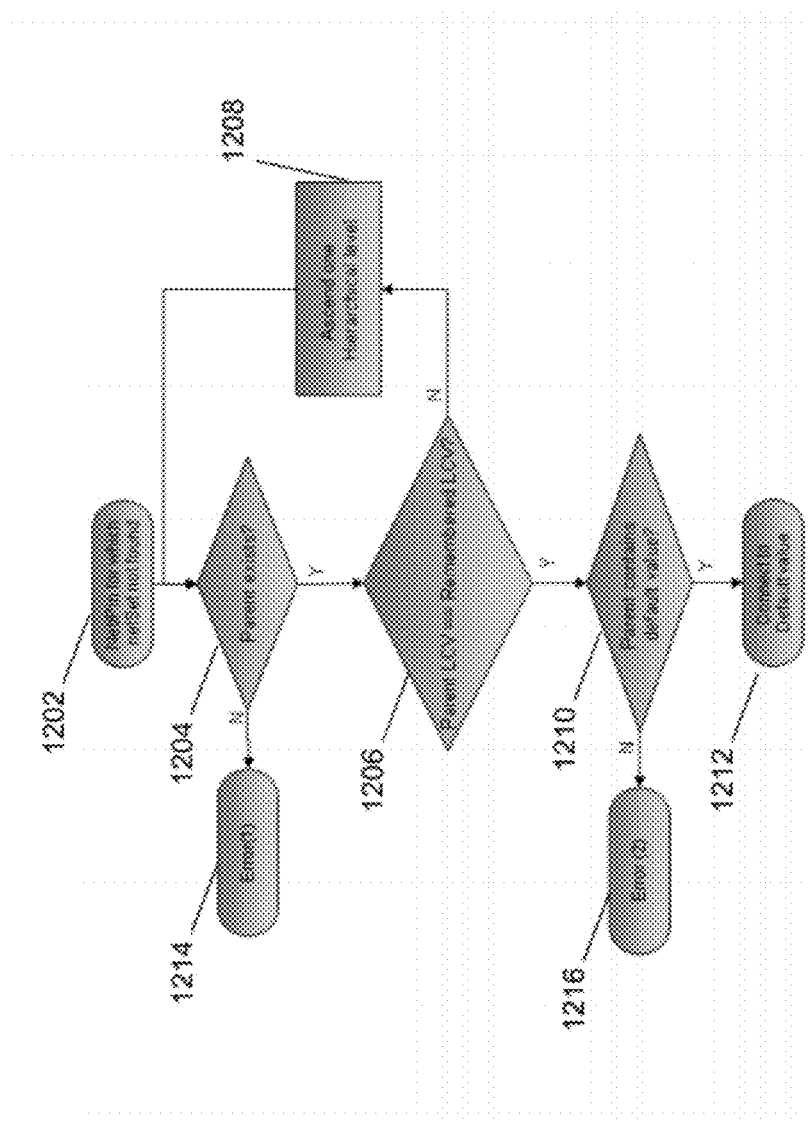
FIG. 11 depicts a flowchart of an approach for default resolution of inherited connections according to some embodiments of the invention.

A search upwards through the hierarchy will now begin, where the ancestor instance (e.g., a parent cell instance which contains the net/pin object under consideration) is determined (1016). If an ancestor instance upward in the hierarchy is not found at (1016), then the actions of FIG. 11 are taken.

However, if such an ancestor instance is found to exist at (1016), and that instance does not contain a netSet property which matches the property name being searched for at (1020), then the process returns back to (1016) to traverse upwards in the hierarchy in an attempt to identify another ancestor instance.

If the identified ancestor instance does contain a netSet property which matches the property name being searched for (1020), then the corresponding signal (net/pin) object specified in the netSet is connected to (1026), unless that object itself contains a further net expression property denoting a re-parameterization (1024). If the corresponding signal object does contain a re-parameterizing net expression of its own (1028), then the search returns back to (1012) to 'remember' the new property name and corresponding default, and continues but now searching for this new property.

The search upward continues for each failed ancestor instance (i.e. each cell instance in the ancestry which does not contain a netSet property corresponding to the search property), until either a match is found, or the top of the design hierarchy is reached (no more ancestry). In this latter case, the defaulting mechanism of FIG. 11 is applied.

Note that the approach allows for multiple re-parameterizations at multiple levels of the design, as will often be the case when IP consists of sub-IP consists of sub-sub-IP, and at each state the IP integrator attempts to resolve the various property names by re-parameterizing to a new search based on a unified name.

Therefore, the embodiments of the invention improves the net expression mechanism by allowing the specification of a property name that is associated with a scoped global net, where the scoped global net introduces encoding of a module (assumed to be either the current module (containing the inherited connection pin/net) or some ancestor of the current module in the occurrence hierarchy). In some embodiment, the scoping filter comprises a L.C:V triplet that is encoded to represent the master of the IP top level itself, along with a local netname.

With this approach, the net expression has been constrained such that its default must exist in the sub-scope of some instance of the given L.C:V (the IP block) and cannot ever inadvertently connect via the default mechanism to some other signal in another module that is not wholly contained within the IP hierarchy. As noted in the above discussion of FIG. 10, a search is made up the hierarchy to search for an ancestor occurrence of the specified library/cell/view, and then searches within that.

After an ancestor search fails to locate an appropriate netSet, the new defaulting mechanism operates as shown in FIG. 11. This mechanism starts again with a net/pin that has a netExpr, and for which the search up the hierarchy failed to find a netSet (1202). Instead of binding to a global net, the search now start a second search up the hierarchy (1204), looking to find an occurrence (on the lineage path of the current block) of the IP top-level scope (L.C:V) that was specified in the new default of the netExpr for our net pin (1206). If the remembered scope (L.C:V) does not match the ancestor scope (L.C:V) at (1206), then the search will ascend one level up the hierarchy at (1208).

If the search finds one at (1206), and it contains a default signal (i.e., which was remembered at (1014)), then a connection is made to that signal at (1212). The connection is now entirely resolved within the IP itself.

If the search finds the L.C:V scope for the top level at (1206), and it does not contain the default-signal as a local net (1210), then an error condition (1216) is raised and the search stops its traversal up the hierarchy. As a result, this approach has limited the scope of the search to the IP itself, and will not search above it or outside it.

At any point, if the signal has not yet been resolved and the search has ascended all the way to the top without encountering the IP top level L.C:V (i.e., no ancestor exists at 1204), then an error condition is raised at (1214).

Figure 3:
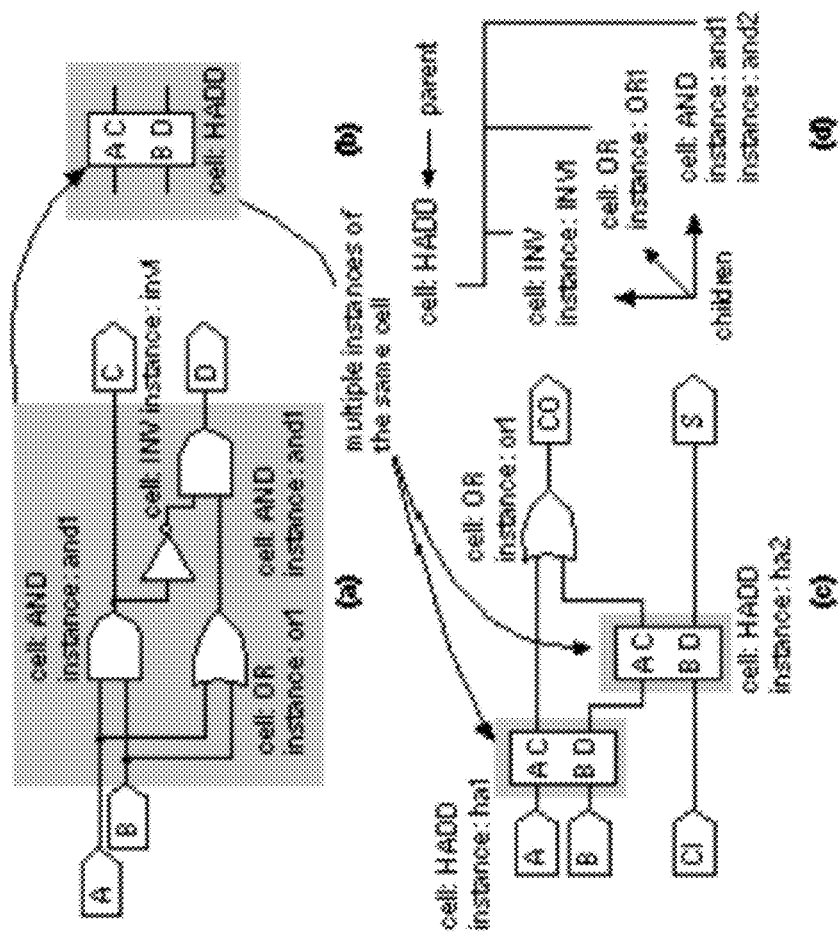
FIG. 3(a)-(d) provide illustrative examples of circuit schematic hierarchies.
Figure 6:
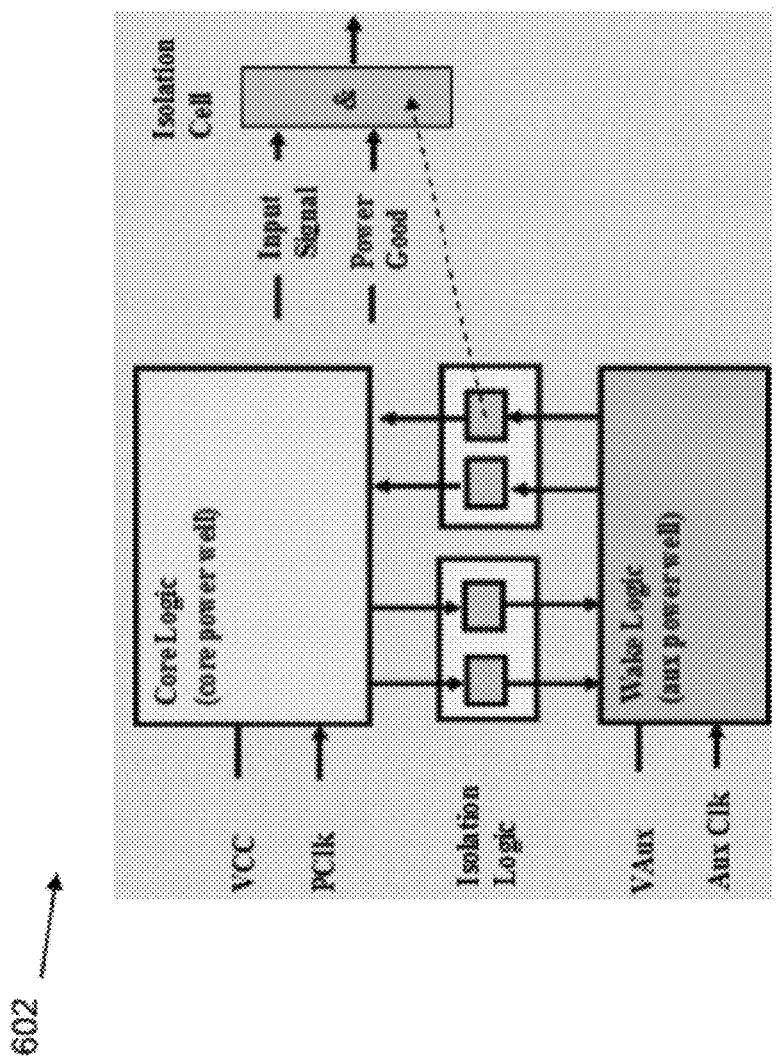
FIG. 6 illustrates example power connections.

Therefore, the invention has now provided a scoped approach to implementing inherited connections. Referring back to the illustrated example of FIG. 9, the defaulting mechanism will not allow both pins pwr1 and pwr2 to obtain a default connection to the same signal vdd! unless both pins are associated with the same scoping filter (e.g., the same L.C:V values). In the example of FIGS. 3(*a*)-(*d*), to the extent explicit connections are not made and inherited connections cannot be resolved for the hierarchical components, then default scoped connections are implemented such that those default connections are not global in nature but are scoped by a scoping criteria. For power related application such as shown in FIGS. 5-6, embodiments of the invention may be employed to ensure that default connections are applied only if scoped criteria are met for the default global nets such as VDD or VSS.

Figure 12:
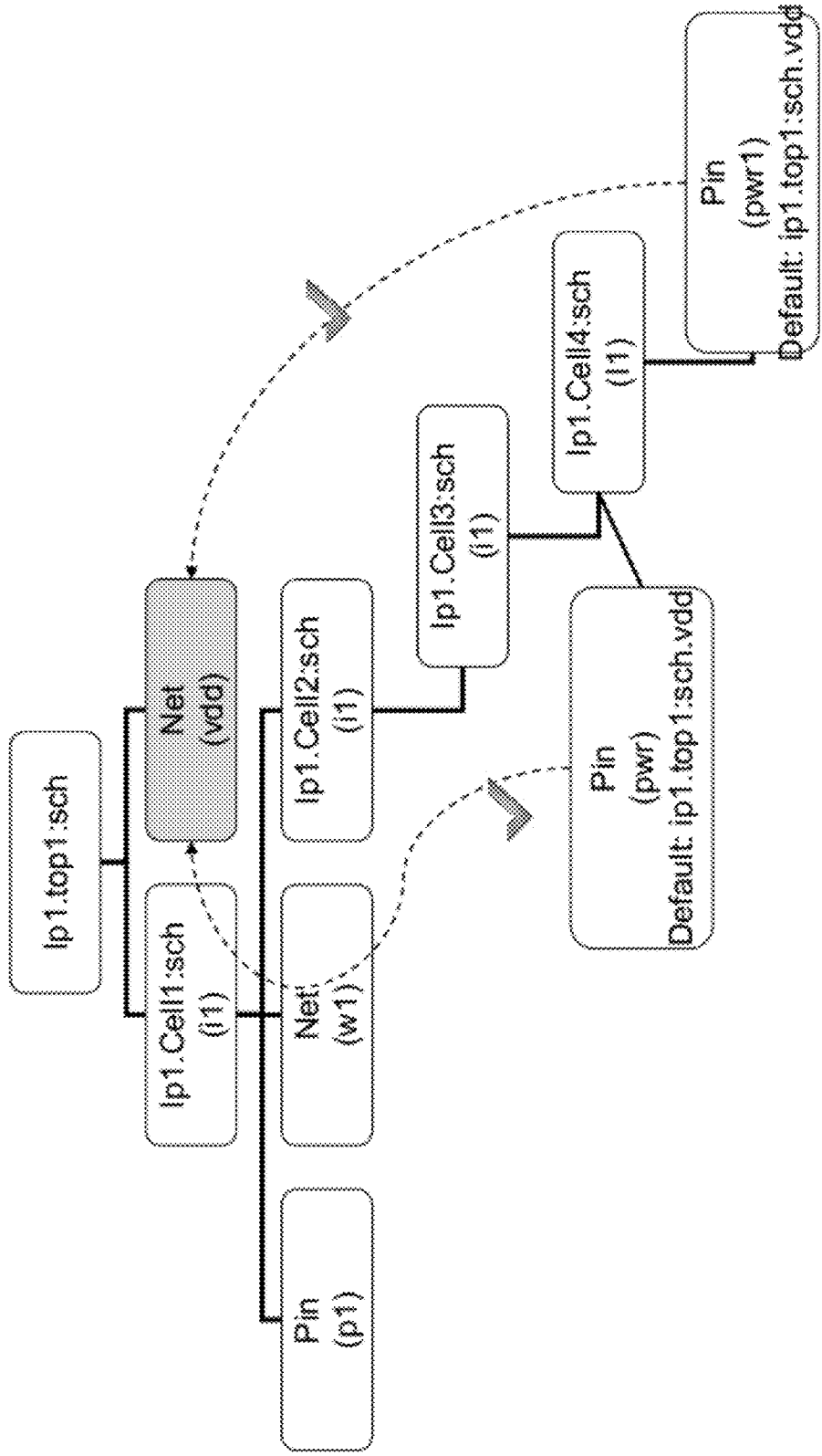
FIG. 12 illustrates an example situation involving full L.C:V match for successful connection inheritance.
Figure 13:
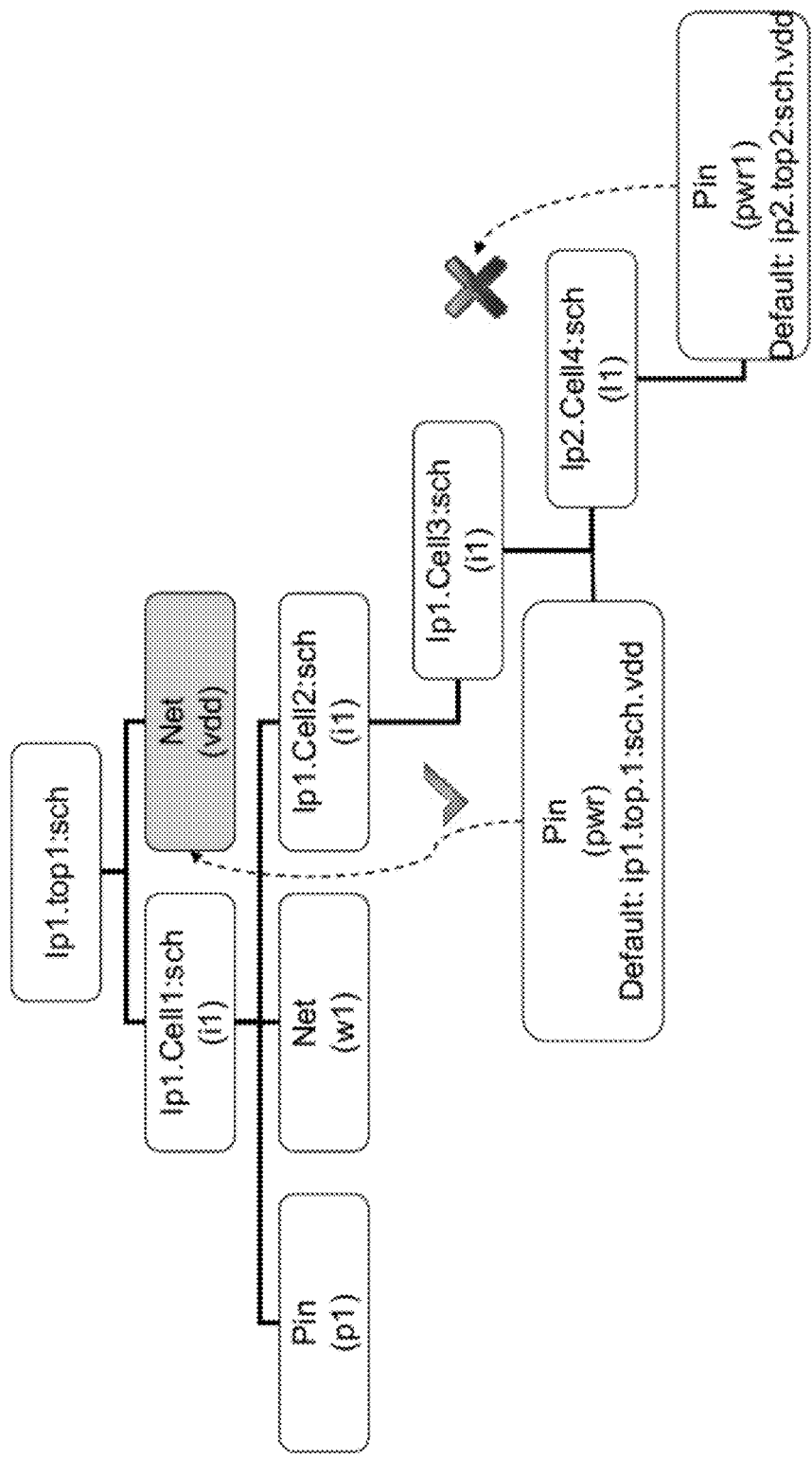
FIG. 13 illustrates an example situation in which an inherited connection is not made because of a L.C:V mismatch.

FIGS. 12 and 13 provide illustrations of example design hierarchies in which cell names for L.C:V have been fully specified, and where pins containing inherited connection references include a default value vdd which also further include a L.C:V prefix. FIG. 12 shows the success case, in which L.C:V values match. As a result, two inherited connections are successfully connected in this hierarchy. One inherited connection is for pin 'pwr' which belongs to cell3, and the second is for pin 'pwr1' which belongs to cell4.

FIG. 13 illustrates an Error case where an inherited connection is not made because of a L.C:V mismatch. In this Error case, it is noted that the cell 4 comes from a different library Ip2 (which has a fully qualified name of Ip2.Cell4:sch). This cell contains an instance of a Pin (pwr1), for which the inherited connection default value contains an L.C:V which references a top cell from an IP library ip2 (specifically, Ip1.top2:sch.vdd). In order to connect the pin pwr4 of instance cell4, the search up the hierarchy looks for an ancestor ip2.top2.sch containing a wire vdd, which it never finds, since the only cell in this example containing a wire vdd is Ip1.top1:sch which comes from a different library (i.e., "Ip1"), and so is NOT a match. Hence, the 'X' denotes that the defaulting mechanism has identified a failure and therefore cannot use the default for the inherited connection.

In the general context, any EDA tool or design approach that employed inherited connections can be modified to utilize the improved defaulting mechanism of the present invention, so that scoped default connections are employed.

System Architecture Overview

FIG. 14 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method for assigning a default connection in an electronic design, comprising:
    identifying an object in an electronic design to process for a connection;
    determining that a default for an inherited connection should be employed for the object;
    determining, by using a processor, whether the object is associated with a scoped default connection, in which one or more scoping criteria are associated with the scoped default connection; and
    assigning the scoped default connection to the object if the one or more scoping criteria match for the object.

2. The method of claim 1, in which the one or more scoping criteria comprise a combination of library, cell or view values.

3. The method of claim 1 in which the one or more scoping criteria are recorded for a property name.

4. The method of claim 3 in which the property name is associated with a net expression.

5. The method of claim 3, in which a loop is performed to determine whether an ancestor object is associated with the property name, and failure to identify the ancestor object associated with the property name results in determining that the default for the inherited connection should be employed.

6. The method of claim 1, in which the one or more scoping criteria are matched if an ancestor object has same one or more scoping criteria as the object.

7. The method of claim 6 in which a processing loop is performed to identify whether the ancestor object has the same one or more scoping criteria as the object.

8. The method of claim 1 in which an error condition exists if the scoped default connection cannot be assigned to the object.

9. The method of claim 1 in which a default global connection is not employed if the scoped default connection cannot be assigned to the object.

10. The method of claim 1 in which the scoped default connection comprises a scoped global net.

11. A computer program product embodied on a non-transitory computer usable medium, the non-transitory computer readable medium having stored thereon a sequence of instructions which, when executed by a processor causes the processor to execute a method for assigning a default connection in an electronic design, the method comprising:
    identifying an object in an electronic design to process for a connection;
    determining that a default for an inherited connection should be employed for the object;
    determining, by using the processor, whether the object is associated with a scoped default connection, in which one or more scoping criteria are associated with the scoped default connection; and
    assigning the scoped default connection to the object if the one or more scoping criteria match for the object.

12. The computer program product of claim 11, in which the one or more scoping criteria comprise a combination of library, cell or view values.

13. The computer program product of claim 11 in which the one or more scoping criteria are recorded for a property name.

14. The computer program product of claim 13 in which the property name is associated with a net expression.

15. The computer program product of claim 13, in which a loop is performed to determine whether an ancestor object is associated with the property name, and failure to identify the ancestor object associated with the property name results in determining that the default for the inherited connection should be employed.

16. The computer program product of claim 11 in which the one or more scoping criteria are matched if an ancestor object has same one or more scoping criteria as the object.

17. The computer program product of claim 16 in which a processing loop is performed to identify whether the ancestor object has the same one or more scoping criteria as the object.

18. The computer program product of claim 11 in which an error condition exists if the scoped default connection cannot be assigned to the object.

19. The computer program product of claim 11 in which the scoped default connection comprises a scoped global net.

20. The computer program product of claim 11 in which a default global connection is not employed if the scoped default connection cannot be assigned to the object.

21. A system for assigning a default connection in an electronic design, comprising:
    a processor;
    a memory for holding programmable code, wherein
        the programmable code includes instructions which, when executed by the processor, causes the processor to:
        identify an object in an electronic design to process for a connection;
        determine that a default for an inherited connection should be employed for the object;
        determine, by using the processor, whether the object is associated with a scoped default connection, in which one or more scoping criteria are associated with the scoped default connection; and
        assign the scoped default connection to the object if the one or more scoping criteria match for the object.

22. The system of claim 21, in which the one or more scoping criteria comprise a combination of library, cell or view values.

23. The system of claim 21 in which the one or more scoping criteria are recorded for a property name.

24. The system of claim 23 in which the property name is associated with a net expression.

25. The system of claim 23, in which a loop is performed to determine whether an ancestor object is associated with the property name, and failure to identify the ancestor object associated with the property name results in determining that the default for the inherited connection should be employed.

26. The system of claim 21, in which the scoping criteria is matched if an ancestor object has same one or more scoping criteria as the object.

27. The system of claim 26, in which a processing loop is performed to identify whether the ancestor object has the same one or more scoping criteria as the object.

28. The system of claim 21 in which an error condition exists if the scoped default connection cannot be assigned to the object.

29. The system of claim 21 in which a default global connection is not employed if the scoped default connection cannot be assigned to the object.

30. The system of claim 21 in which the scoped default connection comprises a scoped global net.

* * * * *